United States Patent [19]
Weitz

[11] Patent Number: 5,298,082
[45] Date of Patent: Mar. 29, 1994

[54] METHOD FOR DEGREASING SOLID OBJECTS

[76] Inventor: Gene Weitz, 5498 Worthington Loop, Palm Harbor, Fla. 34685

[21] Appl. No.: 76,332

[22] Filed: Jun. 14, 1993

Related U.S. Application Data

[63] Continuation-in-part of Ser. No. 863,939, Apr. 6, 1992, abandoned.

[51] Int. Cl.$^5$ .............. B08B 3/00; B08B 3/04; C23G 5/00
[52] U.S. Cl. .............. 134/40; 134/10; 134/30; 134/26; 134/12
[58] Field of Search .............. 134/40, 26, 30, 12, 134/10

[56] References Cited

U.S. PATENT DOCUMENTS

| | | | |
|---|---|---|---|
| 3,460,990 | 8/1969 | Barday | 134/40 |
| 4,589,926 | 5/1986 | Holmstrand | 134/12 |
| 4,817,646 | 4/1989 | Brooks | 134/40 |
| 5,062,438 | 11/1991 | Micheletti | 134/26 |

OTHER PUBLICATIONS

John M. Hyde, "New Developments in CIP Practices", Chemical Engineering Progress, Jan. 1985, pp. 39–41.

*Primary Examiner*—R. Bruce Breneman
*Assistant Examiner*—Zeinab El-Arini
*Attorney, Agent, or Firm*—Joseph C. Mason, Jr.; Ronald E. Smith

[57] ABSTRACT

A degreasing method and system which subjects dirty and oily parts to a bath of relatively impure solvent and thereafter rinsing such parts in relatively pure solvent. The rinsing is performed above the bath so that the relatively pure solvent used as a rinse falls into the bath and recharges it. The relatively pure solvent is continuously obtained by distilling a portion of the solvent from the bath in a closed continuous flow system. The novel solvent used is a mixture of esters of low molecular weight aliphatic carboxylic acid and a normally liquid branched chain alkane.

6 Claims, 1 Drawing Sheet

METHOD FOR DEGREASING SOLID OBJECTS

This is a continuation-in-part of copending application Ser. No. 07/863,939 filed on Apr. 6, 1992, now abandoned.

BACKGROUND OF THE INVENTION

1. Field of the Invention

This invention relates to a liquid phase degreasing method, a system and apparatus, and solvent therefor.

2. Description of the Prior Art

A variety of contaminates in the form of lubricants, including petroleum products, water soluble oils and synthetic or semisynthetic fluids, are employed in metal working and in the repair of metallic objects such as automobile parts. Some of these fluids pose difficult problems for removal of these contaminants from the surface of the objects. Many of these problems are associated with environmental concerns both from an atmospheric pollution and waste disposal standpoint.

The prior art solutions to these cleaning problems have been directed to vapor degreasers using chlorinated solvents such as 1, 1, 1-trichloroethane, trichloroethylene, perchloroethylene or methylene chloride. The term "degreaser" is a term of art for removing all manner of contaminants from solid surfaces such as oil, grease, welding flux, water surfactants, metal salts and the like.

However, the prior art vapor degreasers pose significant environmental problems. The chlorinated solvents frequently break down and form corrosive hydrochloric acid in the presence of water. The vapor phase operation requires the use of expensive vapor recovery systems without which there would be significant atmospheric pollution. For example, U.S. Pat. No. 3,460,990 to Barday illustrates the complicated means needed in a closed system to perform the steps of a vapor degreasing method.

It is thus apparent that a need exists for a degreasing method and system which minimizes the dangers of waste disposal and atmospheric pollution in a simple cost effective manner. However, the prior art, when considered as a whole, neither taught nor suggested to those of ordinary skill in this art at the time the present invention was made how such need could be fulfilled.

SUMMARY OF THE INVENTION

According to the present invention, the liquid degreasing method and system subjects contaminated objects, such as automobile parts, to a liquid bath of relatively impure cleaning solution or solvent in an open tank and thereafter rinses the objects with a liquid spray of relatively pure cleaning solution or solvent. The relatively pure solvent is obtained in continuous fashion by distilling a portion of the relatively impure solvent in a distillation tank and returning the distillate to the spray means for use in the rinse cycle. Pure, distilled solvent is held in a holding reservoir prior to its return to the spray means. When the distillation tank is full, and the volume of the pure solvent tank is down an equivalent amount, the distillation cycle is started to replenish the pure solvent holding reservoir and to purify the relatively impure solvent overflowing into the distillation tank from the liquid bath.

The spraying of the object to be degreased takes place directly above the bath of relatively impure solvent. Thus, the rinse solution of relatively pure solvent falls under the influence of gravity into said bath, thereby continually recharging it. During each cleaning and subsequent rinsing cycle, a small percentage of the relatively impure cleaning solution overflows into the distillation tank as aforesaid and is purified. Thus, the system is a substantially closed system, i.e., the liquid bath is drained at very infrequent intervals, and make up solvent is required infrequently and in small amounts. The cleansed objects are dried by forced hot air which also acts as a diluent to any vaporous material escaping the system.

In an embodiment of the invention, the method of degreasing the surface of solid objects comprises the steps of:

immersing an object in a liquid bath comprising a relatively impure solvent selective for the contaminants;

removing the object from the liquid bath and positioning it above said liquid bath;

subjecting the object to a liquid spray wash comprising relatively pure solvent selective for the contaminants so that the relatively pure solvent, after having been sprayed on the object, falls into the liquid bath;

contacting the object with a gaseous drying medium;

continuously removing a portion of the relatively impure solvent from said liquid bath and purifying such removed portion by distilling therefrom relatively pure solvent; and returning the distilled relatively pure solvent to said liquid spray wash.

In another embodiment of the invention, a system for degreasing the surface of solid objects comprises:

a unitary vertically disposed elongated chamber open to the atmosphere containing a liquid bath zone in the lowermost portion of the chamber, a liquid rinse zone immediately above the liquid bath zone, and a gaseous drying zone at the uppermost portion of the chamber above the rinse zone;

liquid purification means comprising a distillation zone connected to the liquid bath zone for receiving a portion of the liquid bath and connected to the rinse zone for providing a source for liquid rinse;

means connected to the gaseous drying zone for supply of drying medium thereto; and means for vertically transporting objects sequentially to and through the bath zone, the rinse zone, and the drying zone.

A further embodiment of the system includes means for vertically transporting objects which comprises an object container basket supported by a tray support means movably connected to means suitable for vertical movement, up and down, of the tray within the system.

Another embodiment of the invention is a degreaser solvent comprising a mixture of esters of low molecular weight aliphatic carboxylic acid and a normally liquid branched chain alkane.

Solvents which are preferred in the practice of this invention are broadly esters with a co-solvent such as an isoparaffin, i.e., a normally liquid branched chain alkane, having from 5 to 20, preferably from 11 to 14 carbon atoms per molecule having a boiling range from 450° F. to 550° F., e.g., from 475° F. to 530° F. Such solvents are preferable to the prior art halogenated, olefinic and/or aromatic solvents which pose environmental concerns. Typically, the solvents useful in the practice of this invention will be (i) those with a flash point of 140° F.–160° F. TCC, and (ii) those at a higher range of from 190° F.–260° F. TCC. It is distinctly preferred that the selective solvent be a mixture of components having substantially the same boiling range, so that the system will be operational over a wide range of inventive solvent mixtures. The compositions of the invention have good wetting ability and solvency power with minimum stable emulsifying tendencies.

The preferred isoparaffin is an isomer or mixture of isomers of dodecane although other isomers from decane through hexadecane are also useful in the practice of this invention. 4-methyl-3, 3-diethyl-1-5-isopropyloctane (IUPAC name) is particularly desirable as a co-solvent. Another useful co-solvent is a tridecane having a boiling range from 430° F.–470° F. It is preferred that the normally liquid branched chain alkanes for use in this invention have a flash point (TCC °F.) of at least 240° F. and a boiling range from 486° F. to 522° F. Its selectiveness for compounds of low polarity make those normally liquid branched chain alkanes attractive as a co-solvent in the inventive cleansing composition.

The primary solvent of this invention includes esters of low molecular weight aliphatic carboxylic acids. Carboxylic acids having from 2 to 16 carbon atoms, preferably 11 to 14 carbon atoms per molecule, are deemed herein to be relatively low molecular weight. These can be either straight chain or branched-chain acids or mixtures thereof in admixture with the alkane co-solvent. Typically, these acids are converted into their respective esters by well-known reactions such as reaction with an alcohol or via the acid chlorides. The carboxylic acid is converted directly into an ester when heated with an alcohol in the presence of a little mineral acid, such as concentrated sulfuric acid. A particularly preferable ester is the -keto ester such as ethylacetoacetate. Other particularly useful esters include octylacetate and decylacetate. It is preferred that the ester solvent component of this invention be an oxoalcohol-branched ester having a flash point (TCC °F.) of at least 260° F. and a boiling range from 464° F. to 545° F.

The solvent compositions of the present invention have desirable characteristics such as non-toxicity, relatively high flash point, high solvency, and low environmental impact which features enhance their usefulness under a variety of circumstances. These relatively low molecular weight aliphatic carboxylicacid esters together with normally liquid branched chain alkanes provide the desired characteristics of contaminant solvency, and low toxicity relative to halogenated hydrocarbons and also have a relatively high flash point. Moreover, the present compositions do not have a harmful effect on the earth's stratospheric ozone layer; depletion of the ozone layer is another problem which is encountered with the use of halogenated hydrocarbons. Further, esters of the present invention generally have a relatively low vapor pressure, and are therefore less volatile, providing the advantage of having lower volatile organic compounds pollutant emissions than prior art compositions.

Care should be taken in solvent selection so that explosive mixtures may be minimized in the open system of this invention.

The primary solvent component of the present inventive solvent composition has the formula $(R_1)OOC(R_3)COO(R_2)$ wherein $R_1$ and $R_2$ are $C_1$–$C_6$ alkyl, and may be the same or different, and $R_3$ is —$(CH_2)_n$—, wherein n is an integer from 2 to 8. Preferably n is 2, 3 or 4. Examples include ethyl adipate, dimethyl adipate, dimethyl glutarate, or any combination thereof.

Other esters with longer chain alkyl groups derived from alcohols, such as ethyl, propyl, isopropyl, butyl, amyl, and oxyl and mixtures thereof including methyl can be employed with satisfactory results. The ester obtained from the oxylalcohol is preferable. Also, the acid portion of these esters can be derived from other lower and higher molecular weight dibasic acids, such as oxalic, malonic, pimelic, suberic, and azelaic acids and mixtures thereof. These and other esters can be employed provided they are mutually soluble with the alkane co-solvent, are not classified as flammable liquids (flash point at or above 140° F. by Tag Closed Cup method) and have at least 2.0 wt. % solubility in water at 77° F. The concentration or ratio of alkane to ester is not considered critical and the percentage of the two components can vary within wide ranges such as from 50 to 95% alkane and conversely 5 to 50% ester, on the basis of the weight percent of those two components only, to increase and decrease solvency. A 50/50 mixture would not be uncommon.

Examples of the inventive solvent blends may include a relatively low boiling blend or a relatively high boiling blend depending upon the needs of the individual user of the method and system, such as:

| Component | Volume Percent (%) | Description | Boiling Range |
|---|---|---|---|
| A. Relatively low boiling blend | | | |
| octylacetate | 5–95 | Acetic acid ester of $C_7$–$C_9$ branched oxoalcohol | 340° F.–420° F. |
| Isoparaffin mixed of $C_{11}$–$C_{14}$ | 95–5 | Aliphatic hydrocarbon of $C_{10}$–$C_{14}$ | 370° F.–410° F. |
| B. Relatively high boiling blend | | | |
| decylacetate | 5–95 | Acetic acid ester of $C_9$–$C_{11}$ branched oxoalcohol | 430° F.–480° F. |
| tridecane | 95–5 | Aliphatic hydrocarbon of $C_{12}$–$C_{15}$ | 430° F.–470° F. |

Similar results may be obtained by using even higher boiling range components such as an isoparaffin having a boiling range from 486° F. to 522° F. and an oxoalcohol branched ester having a boiling range from 464° F. to 545° F.

The useful cleansing compounds of the present invention are insoluble or, preferably, very slightly soluble in water, and may also be somewhat viscous. Therefore, in practice, the compositions may contain emulsifying surfactants in combination with the esters and alkanes. These emulsifying surfactants are nonionic, anionic, cationic or amuphoteric surfactants; preferably, nonionic surfactants such as the condensation products of alkylene oxides, for example ethylene oxide, with any of the variety of hydrophobic morities. Examples include ethoxylated aliphatic alcohols, ethoxylated alkylphenols, ethoxylated amines, amides, and the like. Generally, the added emulsifying agent will range on a weight basis from about 0–20% of the composition. In a preferred embodiment, the inventive composition comprises a mixture of dimethyl edipate, dimethyl succinate, and dimethyl glutarate in a total amount of about 40%–60%, a mixture of 4-methyl-3, 3-diethyl-5-isopropyloctane and an isomeric hexadecane (50-50) in a total amount of from 30%-50%, and an ethoxylated aliphatic alcohol, in a total amount of about 0-10%.

The ester-isoparaffin-emulsifier composition may be used full strength or, in certain applications, diluted with water to as low as about 2% by volume concentration. Full strength solvency without water or emulsifying agent and which behaves as an azeotrope is particularly preferred.

BRIEF DESCRIPTION OF THE DRAWING

Further details and advantages of the present invention will be apparent from the following detailed description, taken in connection with the accompanying drawing which illustrates one embodiment of this invention.

DETAILED DESCRIPTION OF THE PREFERRED EMBODIMENT

Figure 1:
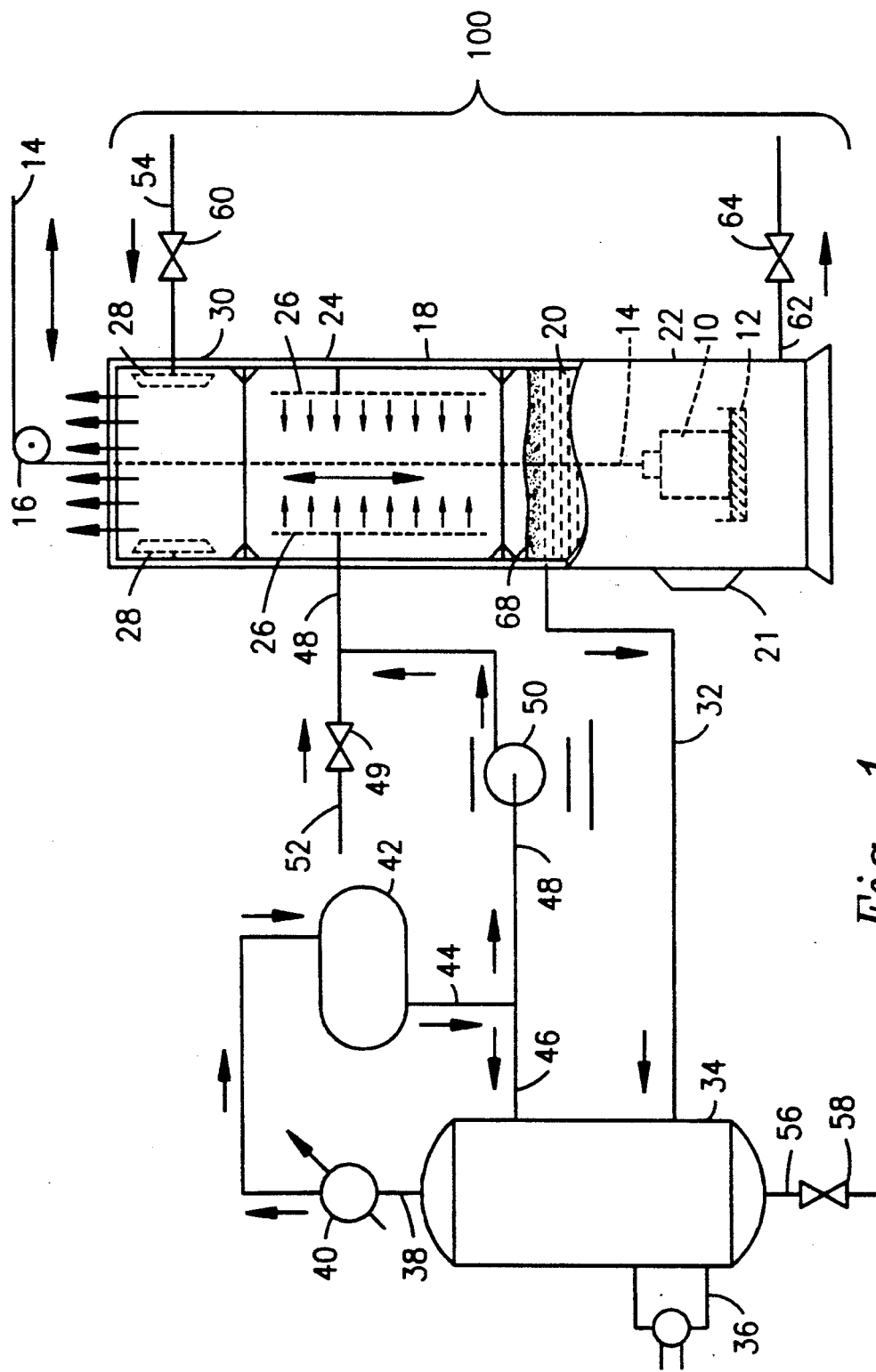

Reference is now made to the drawing which illustrates schematically one embodiment of the system of this invention for degreasing solid objects, such as automobile parts, machine parts, or printed circuit boards. The system includes a vertically disposed elongated chamber 100 open to the atmosphere. The lowermost portion 22 of the chamber is an immersion zone, the middle portion 18 of the chamber is a rinse zone, and the uppermost portion 30 is a gaseous drying zone.

Dirty and oily objects such as automobile parts, or less dirty and less oily parts such as machine parts or printed circuit boards, (not shown) are manually placed into basket 10 which is supported on tray 12 and lowered into the chamber 100, for example, using cable connection 14 operating through pulley system 16. Other means (not shown) may be used in moving the tray 12 within the system such as hydraulically or electrically operated mechanical scissor means. Immersion zone or liquid bath 22 of chamber 100 contains an appropriate solvent 20 which is selective for the dirt and oil on the surface of the object. The cleaning solution in the liquid bath, after use, is never absolutely free of greases and oils. The amount of contaminants within the cleaning composition need only remain below that level at which the solution loses its effectiveness. It has been found that immersion in a relatively impure cleaning solution followed by a rinse of relatively pure cleaning solution achieves superior results over immersion in relatively pure solution alone. The time for immersing the objects in the zone 22 depends considerably on the degree to which its surface is contaminated with oil and grease. Typically, immersion times are from 1-2 minutes to 30 minutes or more; more specifically, typical immersion times are about 5-10 minutes.

Preferably, the liquid in immersion zone 22 is agitated through effective means such as ultrasonic transducer vibration means shown at 21 or through circulation of the fluid therein by means not shown or by other liquid mixing means, not shown, but which will now be obvious to those skilled in the art.

The next step in the inventive method and system is to activate the vertical transport means such as cable 14 over pulley means 16 utilizing motor means not shown. Such activation picks up tray 12 and lifts it vertically including basket 10 resting thereon into rinse zone 18 of chamber 100. The tray and basket may be held at rest in zone 18 or may move continuously through zone 18 at a vertical speed sufficiently low to permit thorough rinsing of the objects contained in basket 10. Alternatively, electrically activated screw means or other vertical transport means (not shown) can provide close control of movement, up and down of the tray 12 and basket 10.

Preferably, rinse medium comprising relatively pure cleaning composition enters the system through conduit 48 from distillation tank 34 and pure solvent holding reservoir 42 and through a plurality of spray nozzles 26 spaced in vertical and circumferential relationship within zone 18. The spray rinse liquid falls from zone 18 into zone 22 as droplets 68 into the immersion liquid 20. Note that the spray rinse liquid 68 that falls under the influence of gravity into the liquid in immersion zone 22 is almost pure, i.e., it is pure solvent that has been used to rinse the part within basket 10. This addition of almost pure or relatively pure solvent continually recharges the liquid in immersion zone 22.

In a preferred embodiment, the tray 12 and basket 10 are next raised into the uppermost portion of chamber 100 which comprises a drying zone 30. The drying fluid may be any inert non-toxic gaseous medium such as air or nitrogen. Preferably, such drying medium is heated by means, not shown to a temperature from 90°-180° F., typically, 120° F. to 160° F. Preferably, and for safety reasons, the temperature is maintained 10° F. to 20° F. below the flash point of the rinse medium. The drying medium enters the system through conduit 54 and control valve 60 from a source not shown. The gases are exhausted from chamber 100 to the atmosphere through at least one opening at the top thereof. The tray and basket containing cleansed objects are removed from the system and put to their intended use. Preferably, the gaseous medium in zone 30 is directed against the object by means, such as an air knife 28, which is vertically and/or circumferentially disposed with respect to zone 30. The tray and basket may be held at rest in zone 30 or may move continuously therethrough. Drying times will vary depending upon the type of cleansing solution used for the immersion bath and the ambient temperature, and whether or not such medium is heated prior to entry into the system, i.e., time may vary from 1-2 minutes to 10-20 minutes, with 5-8 minutes being sufficient in most cases. The volume of the gaseous drying medium will also be dependent upon the composition of the immersion cleaning solution, the ambient temperature, and the temperature of the drying medium itself. However, in all events, the volume of drying fluid should be an amount sufficient to act as a diluent to the vapors rising from within the chamber 100 by evaporation or otherwise. The diluting action of the drying medium significantly lessens the impact of atmospheric pollution on a volume percent basis. Typically, pollutants entering the atmosphere from operation of this invention method should be in the parts per million, e.g. 100-500 ppm vapor by volume which is at a level that is non-hazardous to the environment.

The rinse liquid in zone 18 falls as droplets 68 into liquid bath 20 thereby raising the level of bath 20 above the draw pan means 32 of zone 22. The relatively impure cleaning solution overflows and thus is withdrawn from zone 22 through conduit 32 into distillation column 34. In column 34, the operating conditions are sufficient to separate the oil and grease contaminants from the cleansing solution which are withdrawn as waste through line 56 and control valve 58 to a disposal facility not shown. The relatively pure cleaning composition now devoid of at least a portion of the contaminants is withdrawn as a vapor through conduit 38, condensed in cooler 40, and collected in overhead receiver or pure solvent holding reservoir 42.

Condensed relatively pure cleaning solution in reservoir 42 is withdrawn through conduit 44 with a portion thereof being returned to column 34 as reflux through conduit 46. The balance of said relatively pure cleaning solution flows from reservoir 42 through conduit 48, and pump 50 into zone 18 of chamber 100 as the relatively pure rinse medium. Make-up pure cleaning solution may be added as required through conduit 52 and control valve 49.

Three typical applications of the novel apparatus and method will now be discussed. In a maintenance shop, typically, ten to thirty parts covered with black greasy sludge are cleaned at one time. The wash solution can be contaminated with as high as 40% sludge by volume. For this reason, said wash solution has been referred to as being "relatively impure." The purified rinse solution may contain up to 10% by volume constituents of the sludge but typically will have less than 4%. For this reason, said rinse solution has been referred to herein as being "relatively pure."

Secondly, in a machine shop, typically, thirty to fifty parts covered with light machining oil are cleaned at one time. The wash solution, i.e., the "relatively impure" solution can be contaminated with as high as 20% light machine oil but typically will have less than 10%. The purified (i.e., the "relatively pure") rinse solution may contain up to 4% light machine oil but typically will contain less then 1%.

As a third example, in printed circuit board cleaning, typically, five to thirty printed circuit boards requiring solder flux removal are cleaned at one time. The wash ("relatively impure") solution can be contaminated with as high as 10% solder flux but will typically contain less than 5%. The purified ("relatively pure") rinse solution may contain up to 1% solder flux constituents but will often contain less than 0.1%

The operating conditions in column 34 may be atmospheric, super-atmospheric or sub-atmospheric. Thermal energy for distillation may be provided through reboiler 36 or any other means now known to those skilled in the art. In order to avoid thermal degradation and to minimize energy requirements of the cleaning solution, vacuum distillation of the relatively impure cleaning solution is preferred.

It should also be observed that the continual recharging of immersing liquid 20 by the relatively pure liquid 68 means that said immersion liquid 20 rarely requires changing. However, after long periods of operation, it may become necessary to open valve 64 (lower right hand corner of the drawing) to allow drainage of immersion liquid 20 through conduit 62. It should thus be understood that the novel system is a substantially closed liquid system.

This invention is clearly new and useful. Moreover, it was not obvious to those of ordinary skill in the art at the time it was made, in view of the prior art when considered as a whole.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described, what is claimed is:

1. A method of degreasing the surface of solid objects, comprising the steps of:
   preparing a liquid bath having a relatively impure but effective solvent;
   said relatively impure solvent being contaminated with sludge that may be as high as 40% of said relatively impure solvent by volume;
   immersing a contaminated object in said liquid bath;
   removing the object from the liquid bath;
   preparing a liquid spray rinse having a relatively pure solvent;
   said relatively pure solvent being contaminated with sludge that may be as high as 10% of said relatively pure solvent by volume;
   subjecting the object to said liquid spray rinse so that said liquid spray rinse enters into said liquid bath after it has rinsed said object;
   continuously removing a portion of the relatively impure solvent from the liquid bath and purifying such removed portion by distilling therefrom relatively pure solvent; and
   returning the distilled relatively pure solvent to the liquid spray rinse so that said relatively pure solvent, after being sprayed onto said object, is added to said liquid bath to recharge said liquid bath so that the percentage of contaminants in said liquid bath remains within said volumetric range;
   all of said steps being performed in a substantially closed liquid system.

2. The method of claim 1, further comprising the step of contacting the object with a gaseous drying medium.

3. A method of degreasing the surface of solid objects, comprising the steps of:
   preparing a liquid bath having a relatively impure but effective solvent;
   said relatively impure solvent being contaminated with sludge that may be as high as 20% of said relatively impure solvent by volume;
   immersing a contaminated object in said liquid bath;
   removing the object from the liquid bath;
   preparing a liquid spray rinse having a relatively pure solvent;
   said relatively pure solvent being contaminated with sludge that may be as high as 4% of said relatively pure solvent by volume;
   subjecting the object to said liquid spray rinse so that said liquid spray rinse enters into said liquid bath after it has rinsed said object;
   continuously removing a portion of the relatively impure solvent from the liquid bath and purifying such removed portion by distilling therefrom relatively pure solvent; and
   returning the distilled relatively pure solvent to the liquid spray rinse so that said relatively pure solvent, after being sprayed onto said object, is added to said liquid bath to recharge said liquid bath so that the percentage of contaminants in said liquid bath remains within said volumetric range;
   all of said steps being performed in a substantially closed liquid system.

4. The method of claim 3, further comprising the step of contacting the object with a gaseous drying medium.

5. A method of degreasing the surface of solid objects, comprising the steps of:
- preparing a liquid bath having a relatively impure but effective solvent;
- said relatively impure solvent being contaminated with sludge that may be as high as 10% of said relatively impure solvent by volume;
- immersing a contaminated object in said liquid bath;
- removing the object from the liquid bath;
- preparing a liquid spray rinse having a relatively pure solvent;
- said relatively pure solvent being contaminated with sludge that may be as high as 1% of said relatively pure solvent by volume;
- subjecting the object to said liquid spray rinse so that said liquid spray rinse enters into said liquid bath after it has rinsed said object;
- continuously removing a portion of the relatively impure solvent from the liquid bath and purifying such removed portion by distilling therefrom relatively pure solvent; and
- returning the distilled relatively pure solvent to the liquid spray rinse so that said relatively pure solvent, after being sprayed onto said object, is added to said liquid bath to recharge said liquid bath so that the percentage of contaminants in said liquid bath remains within said volumetric range;
- all of said steps being performed in a substantially closed liquid system.

6. The method of claim 5, further comprising the step of contacting the object with a gaseous drying medium.

* * * * *